(12) United States Patent
Hwang et al.

(10) Patent No.: US 8,503,260 B2
(45) Date of Patent: Aug. 6, 2013

(54) SEMICONDUCTOR MEMORY DEVICE, METHOD OF TESTING THE SAME AND SYSTEM OF TESTING THE SAME

(75) Inventors: Jeong-Tae Hwang, Gyeonggi-do (KR); Jeong-Hun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 196 days.

(21) Appl. No.: 13/104,262

(22) Filed: May 10, 2011

(65) Prior Publication Data

US 2012/0155203 A1    Jun. 21, 2012

(30) Foreign Application Priority Data

Dec. 17, 2010    (KR) .................... 10-2010-0129689

(51) Int. Cl.
*G11C 29/00*    (2006.01)
*G11C 8/00*    (2006.01)

(52) U.S. Cl.
USPC .................. 365/201; 365/230.03; 365/233.1

(58) Field of Classification Search
USPC ................... 365/201, 230.03, 233.1
See application file for complete search history.

(56) References Cited

U.S. PATENT DOCUMENTS

| | | | |
|---|---|---|---|
| 6,304,502 B1 * | 10/2001 | Watanabe et al. | 365/201 |
| 6,396,768 B2 * | 5/2002 | Ooishi | 365/233.1 |
| 6,400,623 B2 * | 6/2002 | Ohno | 365/201 |
| 6,483,760 B2 * | 11/2002 | Kang | 365/201 |
| 6,536,005 B1 * | 3/2003 | Augarten | 365/201 |
| 6,823,485 B1 * | 11/2004 | Muranaka | 365/201 |
| 6,917,563 B2 * | 7/2005 | Lindstedt et al. | 365/201 |
| 7,245,141 B2 * | 7/2007 | Ong | 365/201 |
| 7,249,294 B2 * | 7/2007 | Lee et al. | 365/201 |
| 7,366,965 B2 * | 4/2008 | Yamasaki et al. | 365/201 |
| 7,499,356 B2 * | 3/2009 | Do | 365/201 |
| 7,859,933 B2 * | 12/2010 | Yoshida et al. | 365/201 |

FOREIGN PATENT DOCUMENTS

| | | |
|---|---|---|
| KR | 1020050073969 | 7/2005 |
| KR | 100827658 | 5/2008 |
| KR | 100855575 | 9/2008 |

OTHER PUBLICATIONS

Office Action issued by the Korean Intellectual Property Office on Apr. 18, 2012.
Notice of Allowance issued by the Korean Intellectual Property Office on Nov. 28, 2012.

* cited by examiner

*Primary Examiner* — Trong Phan
(74) *Attorney, Agent, or Firm* — IP & T Group LLP

(57) ABSTRACT

A method of testing a semiconductor memory device comprises receiving a clock, addresses, commands, and data from a test device through channels, generating an internal bank address in response to the addresses and the commands, performing a multi-bit parallel test for each of a plurality of banks based on the addresses, the commands, the data, and the internal bank address, and providing the test device with a test result signal.

13 Claims, 2 Drawing Sheets

SEMICONDUCTOR MEMORY DEVICE, METHOD OF TESTING THE SAME AND SYSTEM OF TESTING THE SAME

CROSS-REFERENCE TO RELATED APPLICATIONS

The present application claims priority of Korean Patent Application No. 10-2010-0129689, filed on Dec. 17, 2010, which is incorporated herein by reference in its entirety.

BACKGROUND OF THE INVENTION

Exemplary embodiments of the present invention relate to a semiconductor design technology, and more particularly, to a wafer level test of a semiconductor memory device.

Generally, a semiconductor memory device such as a Dynamic Random Access Memory (DRAM) device supports diverse test items, and diverse tests are performed at a wafer level and a package level to reduce production costs of a semiconductor memory device and to increase a production yield thereof.

Among the tests performed at the wafer level and the package level is a multi-bit parallel test, which is simply referred to as a parallel test hereafter, for shortening test time.

The background of the parallel test is described as follows. In a semiconductor memory device, it is important to test thousands of memory cells at a high speed as well with a high reliability. Particularly, whether to shorten the development period and the test time of a semiconductor memory device directly affect the manufacturing costs of the products. Thus, reducing the test time is significant in the production efficiency and the competition between manufacturers. The conventional semiconductor memory device performs a test for each memory cell to determine whether the memory cell is normal or abnormal at the wafer level and the package level. However, as a semiconductor memory device is highly integrated, the test time increases in proportion to the high integration degree. Therefore, a parallel test is suggested to reduce the test time. The operation process of a parallel test is described as follows.

To briefly describe the operation of parallel test, the same data are written in a plurality of cells and an exclusive OR gate is used to read the written data. When the same data are read from the plurality of the cells, the semiconductor memory device is determined to be normal by outputting '1', and when a different data is read from any one among the plurality of the cells, the semiconductor memory device is determined to have a fault by outputting '0'. The parallel test is not performed for each memory cell but performed by simultaneously activating many banks and performing write and read operations, which leads to a reduced test time.

While the parallel test performed at the package level is performed on the basis of each bank, the parallel test performed at the wafer level is performed with respect to all banks at once. This is because a series of operations for selecting a bank is performed for the parallel test performed at the package level but the series of operation for selecting a bank is not performed for the parallel test performed at the wafer level. To have a closer look at the parallel test performed at the wafer level, a probe test device may assign a channel to a certain bank address, e.g. an address <0:1> and other bank addresses, e.g. an address <2> may not be assigned with any channel. Here, the bank address <0:1> is used for another test item and the assigned channel is not used for the parallel test. The bank address <2> is not used for any other test item, and a channel is not assigned to it. Since the number of channels assigned to the probe test device is limited for the parallel test performed at the wafer level, more and more chips (or dies) may be tested simultaneously as the number of channels assigned to each chip (or die) is reduced. After all, the number of channels for testing each chip is minimized to reduce the test time. Here, the pads that are not assigned to a channel, such as the pad for the bank address <2>, are collectively coupled to a predetermined power supply voltage terminal which is provided by the probe test device.

The conventional parallel test, however, has the following features.

According to the conventional technology, a potential fault factor may be detected in each bank only when the parallel test is performed at the package level. Therefore, a countermeasure against the fault factor may be taken only in the semiconductor memory device of the package level. However, since it is difficult to cope with the fault factor at the package level state due to its characteristics, it takes more production time and cost to cope with the detected fault factor at the package level than at the wafer level.

Meanwhile, if a channel for applying the bank address <2> is assigned during the parallel test performed at the wafer level, the number of chips (or dies) to be tested at once is reduced by the limited number of channels. For example, when the probe test device includes 100 channels and four channels are assigned to each chip, 25 chips may be tested in parallel all at once. However, when the probe test device includes 100 channels and five channels including a channel for applying the bank address <2> are assigned to each chip, 20 chips may be tested in parallel all at once. Therefore, the number of chips to be tested at once is decreased and, after all, the entire test time is increased in the testing of all chips included in a wafer.

SUMMARY OF THE INVENTION

An embodiment of the present invention is directed to a semiconductor memory device that may perform a multi-bit parallel test for each bank while minimizing the number of channels assigned to each chip (or die) during a wafer-level parallel test.

In accordance with an exemplary embodiment of the present invention, a method of testing a semiconductor memory device may include: receives a clock, addresses, commands, and data from a test device through channels; generates an internal bank address in response to the addresses and the commands; performs a multi-bit parallel test for each of a plurality of banks based on the addresses, the commands, the data, and the internal bank address; and provides the test device with a test result signal.

In accordance with another exemplary embodiment of the present invention, a semiconductor memory device may include: a test mode controller configured to generate a bank selection mode signal for controlling whether or not to select a plurality of banks and a bank address substitution signal for substituting a first external bank address in response to a plurality of external addresses and a plurality of external commands inputted during a test mode; and a bank selection controller configured to output the bank address substitution signal as an internal bank address by replacing the first external bank address in response to the bank selection mode signal during the test mode.

In accordance with further exemplary embodiment of the present invention, a system of testing a semiconductor memory device may include: a test device configured to provide a plurality of commands and addresses and data through channels and determine a test result in response to a test result signal; and a semiconductor memory device configured to generate an internal bank address based on the commands and addresses during a test mode of the semiconductor memory device and generate the internal bank address based on an external bank address during a normal mode of the semiconductor memory device and configured to output the test result signal by performing a multi-bit parallel test for each of a plurality of banks based on the internal bank address and the data.

DESCRIPTION OF SPECIFIC EMBODIMENTS

Figure 1:
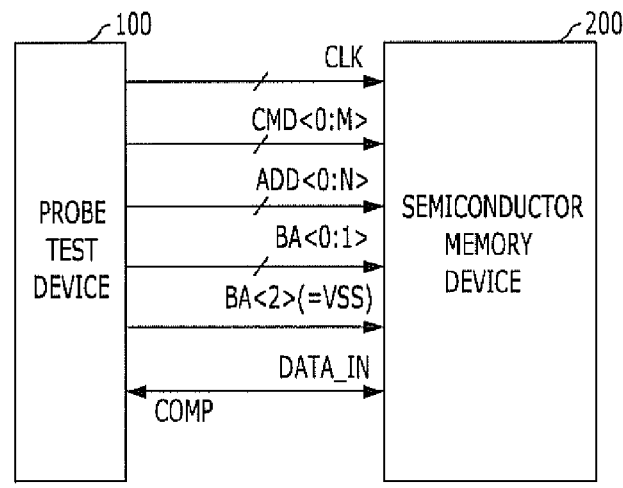
FIG. 1 is a block view illustrating an input and output relationship between a probe test device and a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereafter, a case where a semiconductor memory device includes 8 banks is described as an example.

FIG. 1 is a block view illustrating an input and output relationship between a probe test device and a semiconductor memory device in accordance with an embodiment of the present invention.

Referring to FIG. 1, a probe test device 100 outputs a clock CLK, a plurality of commands CMD<0:M>, a plurality of addresses ADD<0:N>, first and second external bank addresses BA<0:1>, and a data DATA_IN through corresponding channels assigned thereto, and sets a third external bank address BA<2> at the level of ground voltage and output a third external bank address BA<2>. Here, the third external bank address BA<2> is not applied to a semiconductor memory device through a channel just as the other signals, but it is provided through a ground voltage terminal.

A semiconductor memory device 200 generates an internal bank address BA'<2> (see FIG. 2) in response to the addresses ADD<0:N> and the commands CMD<0:M>, performs a multi-bit parallel test for each of a plurality of banks 240 (see FIG. 2) included inside based on the clock CLK, the addresses ADD<0:N>, the commands CMD<0:M>, the first and second external bank addresses BA<0:1>, the internal bank address BA'<2>, and the data DATA_IN, and provides the probe test device 100 with a test result signal COMP. Here, the addresses ADD<0:N>, the commands CMD<0:M>, the first and second external bank addresses BA<0:1>, and the data DATA_IN are inputted through an assigned pad (not shown) of each semiconductor memory device 200, and the third external bank address BA<2> is inputted through a pad (not shown) of the semiconductor memory device 200 which is not assigned. The pad which is not assigned represents a pad which is not coupled with a channel assigned by the probe test device 100 but comprehensively coupled with the ground voltage terminal provided by the probe test device 100.

Figure 2:
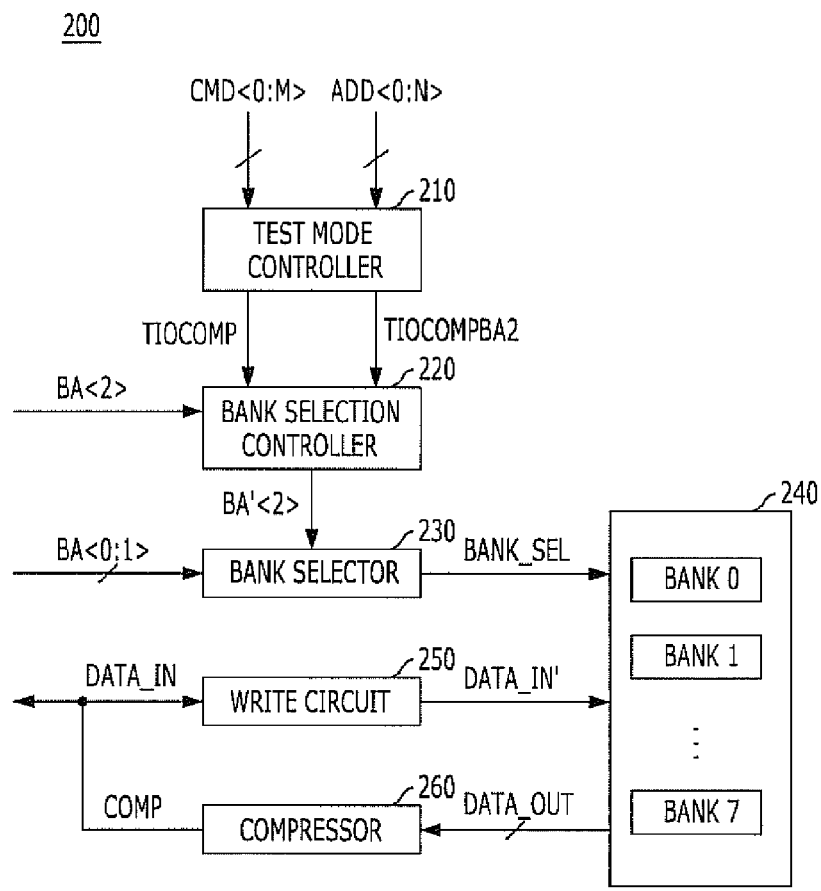
FIG. 2 is a block view illustrating an example of the semiconductor memory device shown in FIG. 1.
Figure 3:
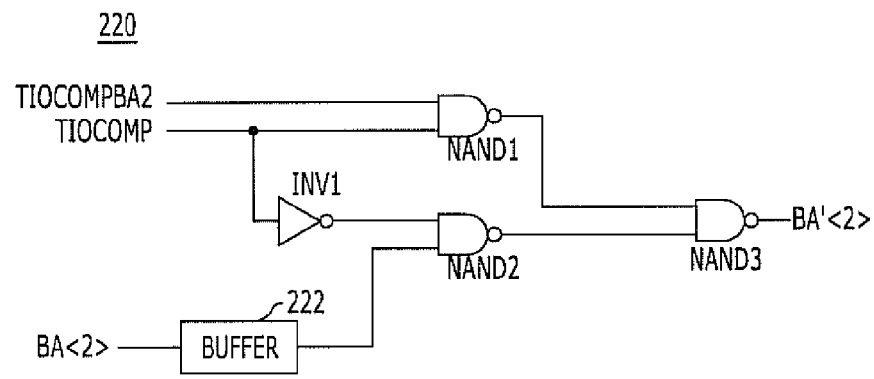
FIG. 3 is an internal block view illustrating an example of a bank selection controller shown in FIG. 2.

FIG. 2 is a block view illustrating an example of the semiconductor memory device shown in FIG. 1, and FIG. 3 is an internal block view illustrating an example of a bank selection controller shown in FIG. 2.

Referring to FIG. 2, the semiconductor memory device 200 includes a test mode controller 210, a bank selection controller 220, first to eighth banks 240, a bank selector 230, a write circuit 250, and a compressor 260. The test mode controller 210 generates a bank selection mode signal TIOCOMP for controlling whether to select a bank and a bank address substitution signal TIOCOMPBA2 for substituting the third external bank address BA<2>, in response to the addresses ADD<0:N> and the commands CMD<0:M>. The bank selection controller 220 outputs the bank address substitution signal TIOCOMPBA2 as the internal bank address BA'<2> in response to the bank selection mode signal TIOCOMP. That is, the bank selection controller 220 generates the internal bank address BA'<2> instead of the third external bank address BA<2>. The first to eighth banks 240 are where data are written/read. The first to eighth banks 240 includes a plurality of banks, for example, the first bank BANK0, the second bank BANK1, ... and the eighth bank BANK7. The bank selector 230 outputs a bank selection signal BANK_SEL to sequentially selects the first to eighth banks 240 in response to the first and second external bank addresses BA<0:1> and the internal bank address BA'<2>. The write circuit 250 writes a data DATA_IN in a bank selected by the bank selector 230. The compressor 260 compresses data DATA_OUT which are provided by the bank selected by the bank selector 230 and outputs a test result signal COMP.

Here, the test mode controller 210 includes a Test Mode Register Set (TMRS).

The bank selection controller 220 outputs the bank address substitution signal TIOCOMPBA2 as the internal bank address BA'<2> during a parallel test mode and outputs the third external bank address BA<2> as the internal bank address BA'<2> during a normal mode. As illustrated in FIG. 3, the bank selection controller 220 includes a first NAND gate NAND1, a first inverter INV1, a buffer 222, a second NAND gate NAND2, and a third NAND gate NAND3. The first NAND gate NAND1 performs a NAND operation onto the bank selection mode signal TIOCOMP and the bank address substitution signal TIOCOMPBA2. The first inverter INV1 inverts the bank selection mode signal TIOCOMP. The buffer 222 buffers the third external bank address BA<2>. The second NAND gate NAND2 performs a NAND operation onto the output signal of the first inverter INV1 and the output signal of the buffer 222. The third NAND gate NAND3 performs a NAND operation onto the output signal of the first NAND gate NAND1 and the output signal of the second NAND gate NAND2 and outputs the internal bank address BA'<2>.

Meanwhile, the write circuit 250 may include an input buffer for receiving a data transferred through a data pad (not shown), an aligner for aligning buffered data obtained from the input buffer, and a write driver for transferring the aligned data obtained from the aligner to the first to eighth banks 240.

Also, the compressor 260 may include an exclusive OR gate. The exclusive OR gate outputs '1' through the data pad (not shown) when all the data DATA_OUT provided by the first to eighth banks 240 have the same logic level and outputs '0' through the data pad (not shown) when any of the data DATA_OUT provided by the first to eighth banks 240 has a different logic level.

Hereafter, the operation of the semiconductor memory device 200 according to the above embodiment of the present invention is described in detail with reference to FIG. 4.

Herein, it is assumed that data were already written in the first to eighth banks 240 according to a write operation and only a read operation is described in the parallel test process in accordance with the embodiment of the present invention.

Figure 4:
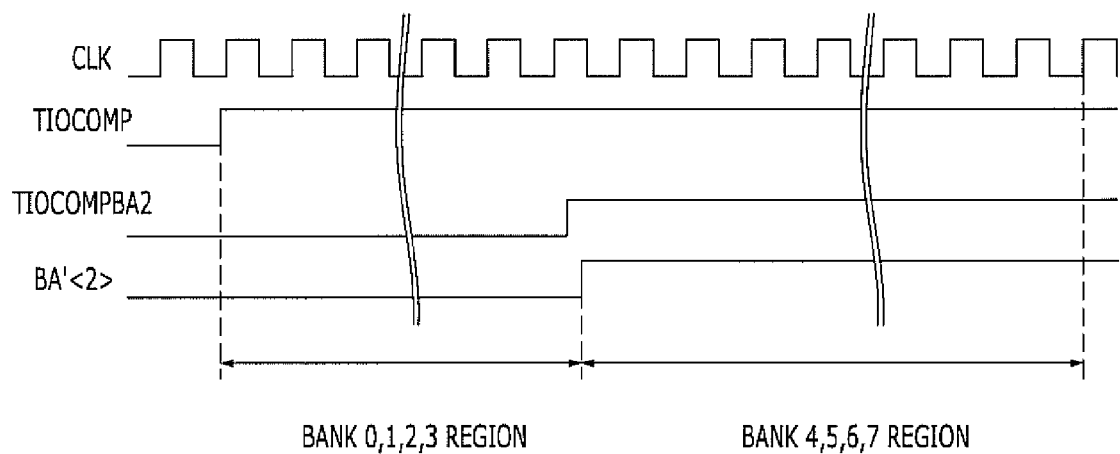
FIG. 4 is a timing diagram describing an operation of the semiconductor memory device shown in FIG. 1.

FIG. 4 is a timing diagram describing an operation of the semiconductor memory device shown in FIG. 1.

Referring to FIG. 4, while a clock CLK is applied from the probe test device 100 to the semiconductor memory device 200, a plurality of commands CMD<0:M>, a plurality of addresses ADD<0:N>, first and second external bank addresses BA<0:1>, and the third external bank address BA<2>, which is set to a ground voltage VSS, are applied to the semiconductor memory device 200. The semiconductor memory device 200 performs a parallel test in response to the applied commands CMD<0:M> and the addresses ADD<0:N>. Although not illustrated in the drawing, the semiconductor memory device 200 may enter a parallel test mode when the seventh address ADD<7> is in a logic high level among the addresses ADD<0:N>. The parallel test is performed as follows.

First of all, the test mode controller 210 enters a bank selection mode in response to the commands CMD<0:M> and the addresses ADD<0:N> and enters an internal bank address substitution mode after a predetermined time passes. To sum up, the test mode controller 210 enters the bank selection mode by enabling a bank selection mode signal TIOCOMP to a logic high level and enters the internal bank address substitution mode by enabling a bank address substitution signal TIOCOMPBA2 to a logic high level.

When the test mode controller 210 enters the bank selection mode, the bank selection controller 220 outputs the bank address substitution signal TIOCOMPBA2 as an internal bank address BA'<2>, and the bank selector 230 sequentially selects the first to eighth banks 240 by decoding the first and second external bank addresses BA<0:1> and the internal bank address BA'<2>. For example, the bank selector 230 sequentially selects first to fourth banks BANK0 to BANK3 of a first bank region BANK0,1,2,3 REGION based on a signal combination of the first and second external bank addresses BA<0:1>, when the internal bank address BA'<2> is of a logic low level, and sequentially selects fifth to eighth banks BANK4 to BANK7 of a second bank region BANK4,5,6,7 REGION based on a signal combination of the first and second external bank addresses BA<0:1>, when the internal bank address BA'<2> is of a logic high level. The sequentially selected first to eighth banks 240 are sequentially activated and perform a read operation. In other words, as the test mode controller 210 enters the bank selection mode, an active ACT operation, a read READ operation, and a pre-charge PCG operation are sequentially performed onto the first to fourth banks BANK0 to BANK3, and as it enters the internal bank address substitution mode, the active ACT operation, the read READ operation, and the pre-charge PCG operation are sequentially performed onto the fifth to eighth banks BANK4 to BANK7.

Meanwhile, the data DATA_OUT read on the bank basis according to a read operation are sequentially compressed by the compressor 260 and are provided to the probe test device 100 as a test result signal COMP. For example, the compressor 260 outputs a test result signal COMP of a logic high level, when all the data DATA_OUT read from the first to eighth banks 240 have the same logic level, and outputs a test result signal COMP of a logic low level, when any one of the data DATA_OUT read from the first to eighth banks 240 has a different logic level. Accordingly, the probe test device 100 makes a decision of 'pass' for a corresponding bank, when the test result signal COMP is of a logic high level, and makes a decision of 'fail' for a corresponding bank, when the test result signal COMP is of a logic low level.

According to the embodiment of the present invention, a parallel test may be performed on the bank basis while minimizing the use of the channel assigned to a probe test device by using a bank address generated internally during the parallel test. Therefore, a fault may be detected on the bank basis at the wafer level.

The technology of the present invention may perform a multi-bit parallel test on a bank basis as well as minimizing the number of channels of a probe test device which are assigned to each chip (or die) by using a bank address generated internally while performing the multi-bit parallel test. Therefore, a fault may be detected on a bank basis at the wafer level and the detected fault may be removed at the wafer level relatively easier than at the package level. Therefore, the production time and cost of semiconductor memory devices may be reduced.

While the present invention has been described with respect to the specific embodiments, it will be apparent to those skilled in the art that various changes and modifications may be made without departing from the spirit and scope of the invention as defined in the following claims.

For example, the third external bank address BA<2> is internally substituted in the embodiment of the present invention, but the scope and spirit of the present invention is not limited to it and the technology of the present invention may be applied to any signal of a pad of a semiconductor memory device which is not assigned and is coupled to a power supply voltage terminal of a predetermined power supply voltage level during a parallel test.

Also, one channel is assigned to output data among the channels assigned to the probe test device in the embodiment of the present invention, but the scope and spirit of the present invention are not limited to it and a plurality of data channels may be assigned according to how a semiconductor memory device is designed.

What is claimed is:

1. A method of testing a semiconductor memory device, comprising:
   receiving a clock, addresses, commands, and data from a test device through channels;
   generating an internal bank address in response to the addresses and the commands;
   performing a multi-bit parallel test for each of a plurality of banks based on the addresses, the commands, the data, and the internal bank address; and
   providing the test device with a test result signal.

2. The method of claim 1, further comprising:
   receiving an external bank address which is set to a selected voltage level from the test device through at least one first pad,
   wherein the clock, addresses, commands and data are received through a plurality of second pads assigned to the channels.

3. The method of claim 2, wherein the generating of the internal bank address includes:
   generating a bank selection mode signal for controlling whether or not to select the banks and a bank address substitution signal for substituting the external bank address based on the addresses and the commands; and outputting the bank address substitution signal as the internal bank address by replacing the external bank address in response to the bank selection mode signal.

4. A semiconductor memory device, comprising:
a test mode controller configured to generate a bank selection mode signal for controlling whether or not to select a plurality of banks and a bank address substitution signal for substituting a first external bank address in response to a plurality of external addresses and a plurality of external commands inputted during a test mode; and
a bank selection controller configured to output the bank address substitution signal as an internal bank address by replacing the first external bank address in response to the bank selection mode signal during the test mode.

5. The semiconductor memory device of claim 4, wherein the first external bank address is set to a selected voltage level during the test mode.

6. The semiconductor memory device of claim 4, further comprising a bank selector configured to sequentially select the banks in response to at least one second external bank address and the internal bank address.

7. The semiconductor memory device of claim 6, further comprising:
a write circuit configured to write an external data in the bank selected by the bank selector; and
a compressor configured to compress data provided by the banks selected by the bank selector and output a test result signal.

8. The semiconductor memory device of claim 7, wherein the external data and the test result signal are respectively inputted and outputted through corresponding data pads.

9. The semiconductor memory device of claim 4, wherein the bank selection controller is configure to output the first external bank address as the internal bank address during a normal mode.

10. The semiconductor memory device of claim 4, wherein the test mode controller comprises a test mode register set (TMRS).

11. The semiconductor memory device of claim 4, wherein the test mode is a multi-bit parallel test mode performed at a wafer level.

12. A system of testing a semiconductor memory device, comprising:
a test device configured to provide a plurality of commands and addresses and data through channels and determine a test result in response to a test result signal; and
a semiconductor memory device configured to generate an internal bank address based on the commands and addresses during a test mode of the semiconductor memory device and generate the internal bank address based on an external bank address during a normal mode of the semiconductor memory device and configured to output the test result signal by performing a multi-bit parallel test for each of a plurality of banks based on the internal bank address and the data.

13. The system of claim 12, wherein the test device is configured to provide a supply voltage through a pad of the external bank address during the test mode.

* * * * *